(12) United States Patent
Park et al.

(10) Patent No.: US 12,080,772 B2
(45) Date of Patent: Sep. 3, 2024

(54) NON-VOLATILE MEMORY DEVICE

(71) Applicant: SK hynix Inc., Icheon-si (KR)

(72) Inventors: Sung Kun Park, Icheon-si (KR); Jae Young Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 18/483,466

(22) Filed: Oct. 9, 2023

(65) Prior Publication Data

US 2024/0038860 A1 Feb. 1, 2024

Related U.S. Application Data

(63) Continuation of application No. 17/330,262, filed on May 25, 2021, now Pat. No. 11,784,230.

(30) Foreign Application Priority Data

Dec. 30, 2020 (KR) ........................ 10-2020-0187100

(51) Int. Cl.
*H01L 29/423* (2006.01)
*G11C 16/16* (2006.01)
(Continued)

(52) U.S. Cl.
CPC ........ *H01L 29/42328* (2013.01); *G11C 16/16* (2013.01); *G11C 16/26* (2013.01);
(Continued)

(58) Field of Classification Search
CPC .............. H10B 41/10; H01L 27/11519; G11C 16/3427
See application file for complete search history.

(56) References Cited

U.S. PATENT DOCUMENTS 9,293,468 B2 3/2016 Park et al.
10,680,001 B2 6/2020 Taniguchi et al.
2022/0208978 A1 6/2022 Park et al.

OTHER PUBLICATIONS

Park, S.K. et al., "Characterization of Single-Poly SGLC Cell Using 4kbits Array Test Chip for a Low Density Code Storage Embedded NVM Applications." Downloaded Aug. 20, 2020, 4 pages.
(Continued)

*Primary Examiner* — Amar Movva
(74) *Attorney, Agent, or Firm* — Perkins Coie LLP

(57) ABSTRACT

A non-volatile memory device may include a substrate, a first floating gate, a second floating gate, a third floating gate and a fourth floating gate. The substrate may include an active region. The first to fourth floating gates may be formed on the substrate. The first to fourth floating gates may be radially arranged to be partially overlapped with the active region. The first floating gate and the third floating gate may face each other in a first direction. The first floating gate and the third floating gate may have asymmetrically planar shapes. The first floating gate and the second floating gate may face each other in a second direction substantially perpendicular to the first direction. The first floating gate and the second floating gate may have asymmetrically planar shapes. The third floating gate and the fourth floating gate may face each other in the second direction. The third floating gate and the fourth floating gate may have asymmetrically planar shapes. The fourth floating gate and the second floating gate may face each other in the first direction. The fourth floating gate and the second floating gate may have asymmetrically planar shapes.

7 Claims, 5 Drawing Sheets

(51) Int. Cl.
*G11C 16/26* (2006.01)
*G11C 16/34* (2006.01)
*H10B 41/10* (2023.01)
*H10B 41/35* (2023.01)
*H10B 41/41* (2023.01)

(52) U.S. Cl.
CPC ............ *H10B 41/10* (2023.02); *H10B 41/35* (2023.02); *H10B 41/41* (2023.02); *G11C 16/3427* (2013.01)

(56) References Cited

OTHER PUBLICATIONS

Park, S.K. et al., "Improved Performance of Novel Vertical Assist Operating Select Gate Lateral Coupling Cell for Logic Nonvolatile Memory." IEEE Electron Device Letters, vol. 37, No. 4, Apr. 2016, 4 pages.
Park, S.K. et al., "Novel Select Gate Lateral Coupling Single Poly eNVM for an HVCMOS Process." IEEE Electronic Device Letters, vol. 35, No. 3, Mar. 2014, 3 pages.
Park, S.K., "Analysis of Program Disturbance Immunity of VA-SGLC Embedded Nonvolatile Memory." IEEE Transactions on Electron Devices, vol. 67, No. 10, Oct. 2020. 4 pages.

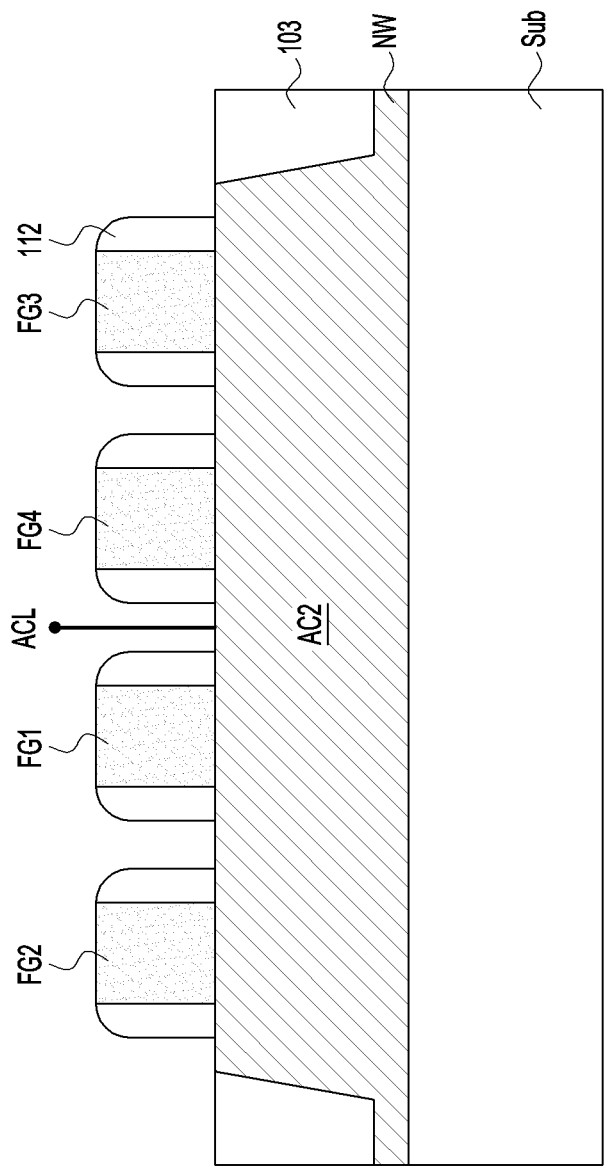

NON-VOLATILE MEMORY DEVICE

CROSS-REFERENCES TO RELATED APPLICATION

This patent document is a continuation of, and claims the priority and benefits of, U.S. patent application Ser. No. 17/330,262, filed on May 25, 2021, which claims the priority and benefits of Korean patent application number 10-2020-0187100, filed on Dec. 30, 2020. The entire contents of the above applications are incorporated by reference as part of the disclosure of this patent document.

TECHNICAL FIELD

The technology and implementations disclosed in this patent document generally relate to a semiconductor device.

BACKGROUND

The growing trend of using mobile devices to access information anytime and anywhere has increased the demand for highly integrated semiconductor devices. System-on chip (SoC) is the technology that integrates several computer components into one semiconductor device. SoC technology makes it possible to fabricate memory and non-memory on a single chip.

Embedded memory is the most sought after by many industries. Embedded memory is an on-chip memory integrated into an SoC that supports logic circuits on the SoC to perform intended functions. One example of the embedded memory is an electrically erasable programmable read only memory (EEPROM). The EEPROM can retain data in absence of power like a read only memory (ROM), and can be erased and reprogrammed through the application of a high voltage.

SUMMARY

The embodiments of the disclosed technology relate to a non-volatile memory device with improved reliability.

In example embodiments of the present disclosure, a non-volatile memory device may include a substrate, a first floating gate, a second floating gate, a third floating gate and a fourth floating gate. The substrate may include an active region. The first to fourth floating gates may be formed on the substrate. The first to fourth floating gates may be radially arranged to be partially overlapped with the active region. The first floating gate and the third floating gate may face each other in a first direction. The first floating gate and the third floating gate may have asymmetrically planar shapes. The first floating gate and the second floating gate may face each other in a second direction substantially perpendicular to the first direction. The first floating gate and the second floating gate may have asymmetrically planar shapes. The third floating gate and the fourth floating gate may face each other in the second direction. The third floating gate and the fourth floating gate may have asymmetrically planar shapes. The fourth floating gate and the second floating gate may face each other in the first direction. The fourth floating gate and the second floating gate may have asymmetrically planar shapes.

In example embodiments of the present disclosure, a non-volatile memory device may include first and second well regions, a device isolation layer, first and second selection gates and first and second floating gates. The first and second well regions may be formed at a substrate. The first and second well regions may have complementary conductive types. The first and second well regions may be arranged parallel to each other along a first direction. The device isolation region may be formed at the substrate to define a first active region in the first well region and a second active region in the second well region. The first and second selection gates may be formed on the substrate. The first and second selection gates may be overlapped with the first active region. The first and second selection gates may be arranged parallel to each other along a second direction substantially perpendicular to the first direction. The first and second selection gates may have a linear shape extended in the first direction. The first and second floating gates may be arranged adjacent to the first and second selection gates, respectively. The first and second floating gates may be overlapped with the first active region and the second active region, respectively. The first and second floating gates may face each other along the second direction. The first floating gate and the second floating gate may have asymmetrically planar shapes.

In example embodiments, the non-volatile memory device may further include a third well region, a third active region and third and fourth floating gates. The third well region may have a conductive type substantially the same as a conductive type of the first well region. The third active region may be defined in the third well region by the device isolation layer. The third active region may be overlapped with the first and second selection gates. The third and fourth floating gates may be arranged adjacent to the first and second selection gates, respectively. The third and fourth floating gates may face each other along the second direction. The third floating gate and the fourth floating gate may have asymmetrically planar shapes along the second direction. The first floating gate and the third floating gate may have asymmetrically planar shapes along the first direction. The second floating gate and the fourth floating gate may have asymmetrically planar shapes along the first direction.

Based on some embodiments of the disclosed technology, the plurality of the floating gates overlapped with the active region may have the asymmetrical planar shapes to prevent a non-uniformity of a coupling ratio with respect to each of the floating gates. Thus, the non-volatile memory device may have a uniform threshold voltage, a sufficient margin of a read operation, and improved operational reliability.

Further, a gap between the selection gates and the active region and a gap between the floating gates may be sufficiently wide to more improve the operational reliability.

BRIEF DESCRIPTION OF THE DRAWINGS

FIG. 4B is a cross-sectional view taken along a line B-B' in FIG. 3.

DETAILED DESCRIPTION

Features of the technology disclosed in this patent document are described by examples of an image sensing device with reference to the accompanying drawings. Although a few embodiments of the disclosed technology will be discussed, the disclosed technology can be implemented in various ways beyond the specifics of the examples described herein.

The disclosed technology can be implemented in some embodiments to provide a non-volatile memory device as an embedded memory that can be used as an analog trimming device in an SoC device that includes a digital circuit and an analog circuit or an internal memory for storing instructions and data that are used by the SoC device.

In some implementations, a first conductive type and a second conductive type may be N-type and P-type, respectively, or vice versa. That is, the non-volatile memory device based on some example embodiments of the disclosed technology may include an N-type channel or the P-type channel. In one example, the first conductive type and the second conductive type are P-type and N-type, respectively, and the non-volatile memory device has an N-type channel.

In some implementations, a first direction and a second direction may be substantially perpendicular to each other. For example, in an X-Y coordinate, the first direction D1 may be an X-direction and the second direction D2 may be a Y-direction.

Figure 1:
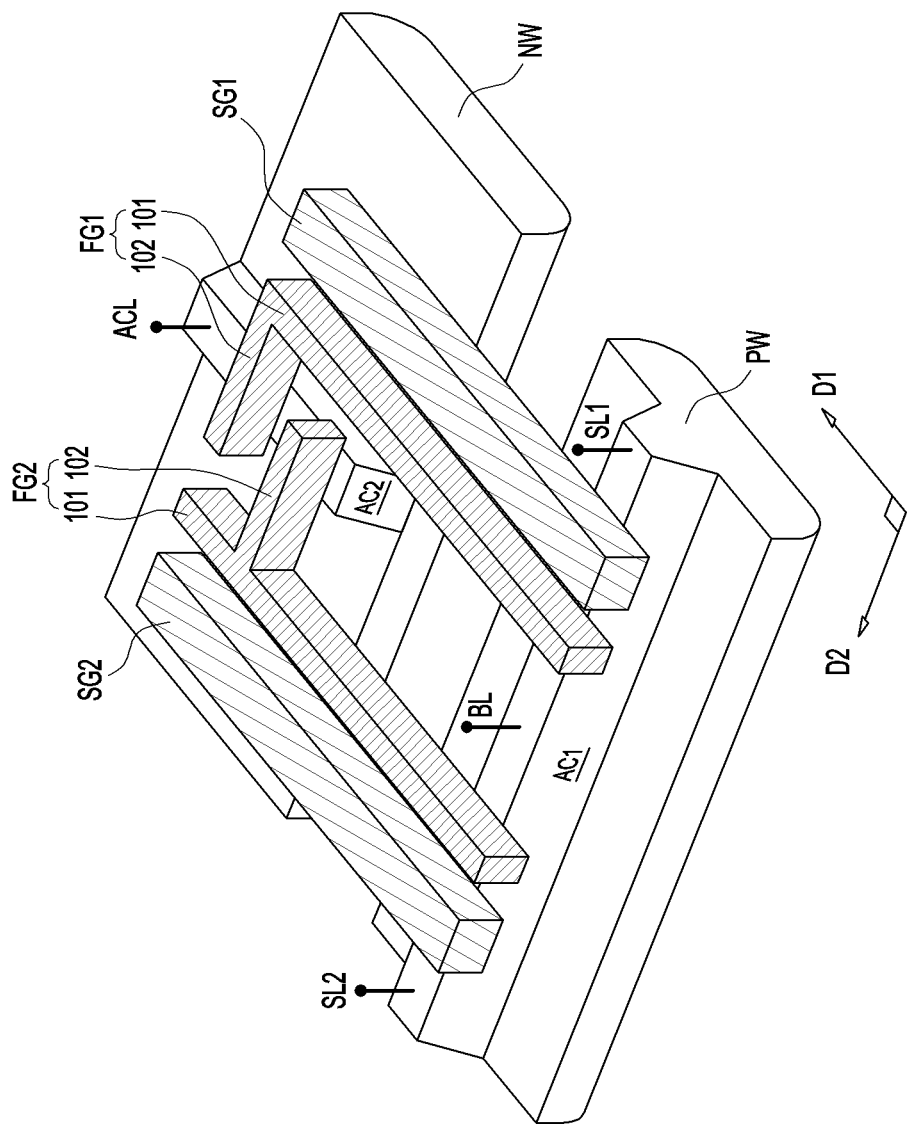
FIG. 1 is an example of a unit cell of a non-volatile memory device based on some embodiments of the disclosed technology.
Figure 2A:
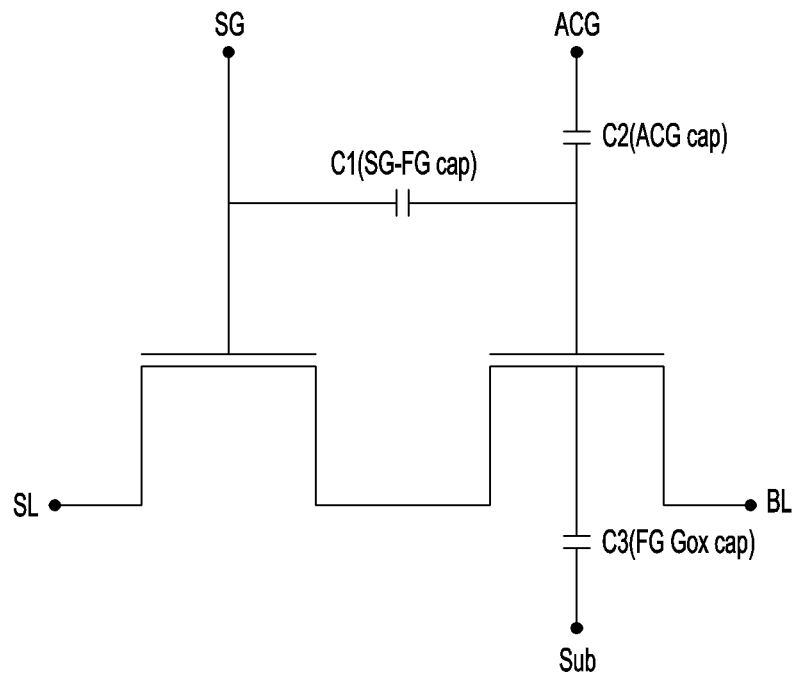
FIGS. 2A and 2B examples of a unit cell of a non-volatile memory device based on some embodiments of the disclosed technology.
Figure 2B:
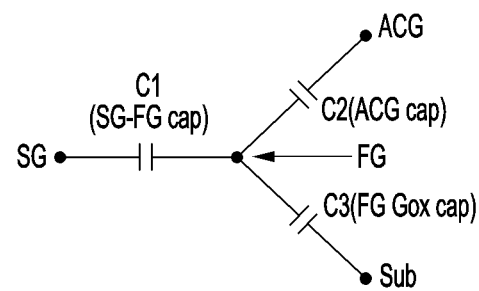

FIG. 1 is an example of a unit cell of a non-volatile memory device based on some embodiments of the disclosed technology. FIG. 1 shows two unit-cells that share a first active region and a second active region for the sake of explanation. FIGS. 2A and 2B are examples of a unit cell of a non-volatile memory device based on some embodiments of the disclosed technology.

In some implementations, the non-volatile memory device may include a plurality of unit cells. Referring to FIGS. 1, 2A and 2B, each of the unit cells may include a first well region PW having a first conductive type and a second well region NW having a second conductive type adjacent to the first well region PW. The first well region PW and the second well region NW may be formed in a substrate. In some implementations, two or more unit-cells may share the first well region PW and the second well region NW. The first well region PW and the second well region NW may have a linear shape extending in the second direction D2. The first well region PW and the second well region NW may be parallel to each other along the first direction D1. In an implementation, the first well region PW and the second well region NW may be spaced apart from each other in the first direction D1. In another implementation, the first well region PW may be in direct contact with the second well region NW in the first direction D1.

Each of the first well region PW and the second well region NW may include a first active region AC1 and a second active region AC2 defined by an isolation layer (not shown) in the substrate (not shown). Each of the unit cells may share the first active region AC1 and the second active region AC2. The first active region AC1 may be used for a programming operation and a read operation. The second active region AC2 may be used for a programming operation and an erase operation. The first active region AC1 may extend in the second direction D2. The second active region AC2 may extend in the first direction D1.

A first unit cell may include a first selection gate SG1 and a first floating gate FG1. The first selection gate SG1 and the first floating gate FG1 may extend in the first direction D1. The first selection gate SG1 may be spaced apart from the first floating gate FG1 in the second direction D2. The first selection gate SG1 may be positioned adjacent to the first floating gate FG1. The first unit cell and a second unit cell adjacent to the first unit cell may share the first active region AC1 and the second active region AC2. The second unit cell may include a second selection gate SG2 and a second floating gate FG2. The second selection gate SG2 and the second floating gate FG2 may extend in the first direction D1. The second selection gate SG2 may be spaced apart from the second floating gate FG2 in the second direction D2. The second selection gate SG2 may be positioned adjacent to the second floating gate FG2.

The first and second floating gates FG1 and FG2 may include a first region 101 and a second region 102. The first region 101 may extend in the first direction D1. The first regions 101 of the first and second floating gates FG1 and FG2 may include a sidewall facing the first and second selection gates SG1 and SG2, respectively. The second region 102 may extend from a portion of the first region 101 along the second direction D2. The second region 102 may overlap with the second active region AC2. In some implementations, the first floating gate FG1 and the second floating gate FG2 may have different shapes depending on where the second region 102 is in contact with the first region 101. For example, the second region 102 of the first floating gate FG1 may be connected to an end of the first region 101 of the first floating gate FG1. In some implementations, the first floating gate FG1 may have a vertical linear structure with a protruding horizontal linear structure at an end of the vertical linear structure. In one example, the first floating gate FG1 may have an "L" shape. In contrast, the second region 102 of the second floating gate FG2 may be connected to a portion of the first region 101 of the second floating gate FG2 other than the end of the first region 101. In some implementations, the second floating gate FG2 may have has a vertical linear structure with a protruding horizontal linear structure. In one example, a cross section of the second floating gate FG2 may have a Tonfa shape or a "T" shape.

The first and second selection gates SG1 and SG2 may overlap with the first active region AC1. The first and second selection gates SG1 and SG2 may be used as a word line WL. The first and second selection gates SG1 and SG2 may function to prevent an over-erase condition in the erase operation. The first and second floating gates FG1 and FG2 may function to store logic information. The first and second floating gates FG1 and FG2 may overlap with the first active region AC1 and the second active region AC2. Because the second active region AC2 may be used as an active control gate ACG, the first and second floating gates FG1 and FG2 may overlap with the second active region AC2. That is, the second active region AC2 may be used as a control gate for controlling the first and second floating gates FG1 and FG2 and the first and second selection gates SG1 and SG2.

Therefore, the first and second floating gates FG1 and FG2 may be electrically activated in response to a bias applied to the first and second selection gates SG1 and SG2, and/or a bias applied to the second active region AC2. That is, the first and second floating gates FG1 and FG2 may be coupled in response to the bias applied to the first and second selection gates SG1 and SG2 and/or the bias applied to the second active region AC2. The first and second floating gates FG1 and FG2 and the first and second selection gates SG1 and SG2 may be coupled to each other by a capacitance across surfaces of the first and second floating gates FG1 and FG2 and the first and second selection gates SG1 and SG2 facing each other. That is, the first and second floating gates FG1 and FG2 may be activated by a component of a first capacitor C1 in response to the bias applied to the first and second selection gates SG1 and SG2. Further, the first and second floating gates FG1 and FG2 and the second active region AC2 may be coupled by a capacitance vertically generated in an overlapping region between the first and second floating gates FG1 and FG2 and the second active region AC2. That is, the first and second floating gates FG1 and FG2 may be activated by a component of a second capacitor C2 in response to the bias applied to the second active region AC2. Because the first and second floating gates FG1 and FG2 may be coupled by the first and second selection gates SG1 and SG2 and/or is the second active region AC2, coupling ratios may be different from each other depending on operational modes. As a result, a disturbance may be suppressed, improving operational reliability.

In FIGS. 2A and 2B, a reference numeral C3 may indicate a third capacitor C3 including the substrate (sub), a gate insulation layer and the first and second floating gates FG1 and FG2. Although not depicted in the drawings, each of the unit cells may include an insulation structure that is formed in a gap or space between sidewalls of the first and second selection gates SG1 and SG2 and the first and second floating gates FG1 and FG2 facing each other. The insulation structure may include a spacer formed on each of sidewalls of the first and second selection gates SG1 and SG2 and the first and second floating gates FG1 and FG2. The spacer may act as a dielectric layer of the first capacitor C1.

Further, in each of the unit cells, a bit line BL may be electrically connected with the first active region AC1 adjacent to the first and second floating gates FG1 and FG2. Source lines SL1 and SL2 may be electrically connected with the first active region AC1 adjacent to the first and second selection gates SG1 and SG2. An activation control line ACL may be electrically connected with the second active region AC2.

Hereinafter, the program operation, the erase operation and the read operation of the unit cell will be discussed with reference to FIGS. 2A and 2B.

The program operation of the unit cell may use a channel hot electron (CHE). For example, the program operation may include applying a positive pumping voltage to the selection gate SG and the second active region AC2, which is used as the active control gate ACG, and applying a program voltage and a ground voltage to the bit line BL and the source line SL, respectively. The positive pumping voltage may be higher than the program voltage. For example, a voltage of about 6V may be applied to the selection gate SG and the active control gate ACG, and a voltage of about 4.5V may be applied to the bit line BL. The pumping voltage may be a voltage obtained by raising voltage from a power supply voltage using, for example, a charge pump.

The erase operation of the unit cell may use a Fowler-Nordheim tunneling. For example, the erase operation may include applying a negative pumping voltage to the selection gate SG, applying a positive pumping voltage to the active control gate ACG, and applying a ground voltage to the bit line BL and the source line SL. An absolute value of the pumping voltage may be higher than an absolute value of the negative pumping voltage. For example, a voltage of about −6V may be applied to the selection gate SG, and a voltage of about 9V may be applied to the active control gate ACG.

The read operation of the unit cell may include applying a power supply voltage to the selection gate SG, applying a read voltage to the bit line BL, and applying a ground voltage to the active control gate ACG and the source line SL. The read voltage may be higher than the ground voltage and lower than the power supply voltage. For example, the power supply voltage may be about −3V and the read voltage may be about 1V.

Hereinafter, the non-volatile memory device of example embodiments may be illustrated in detail with reference to FIG. 3.

Figure 3:
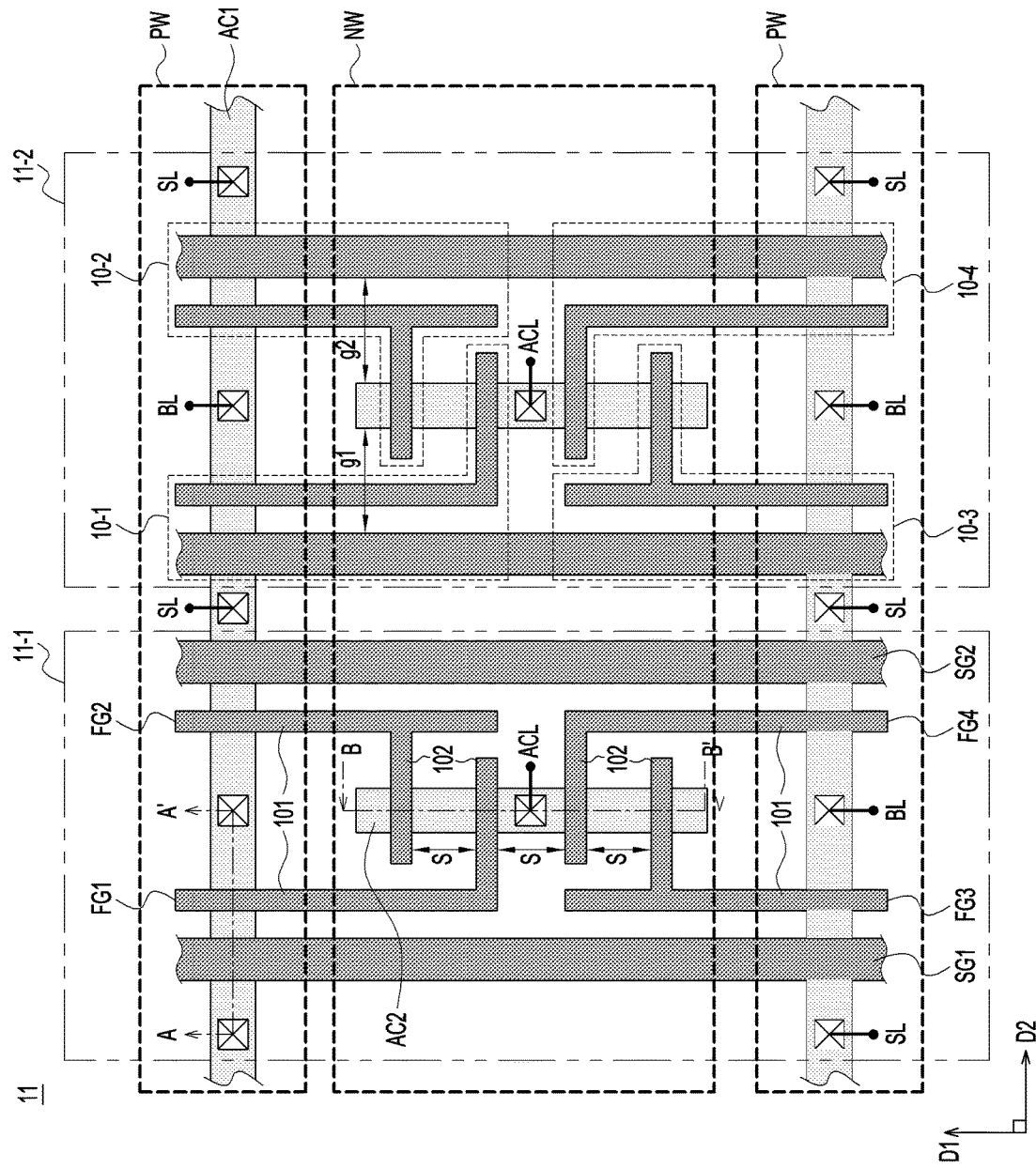
FIG. 3 is an example of a cell array of a non-volatile memory device based on some embodiments of the disclosed technology.
Figure 4A:
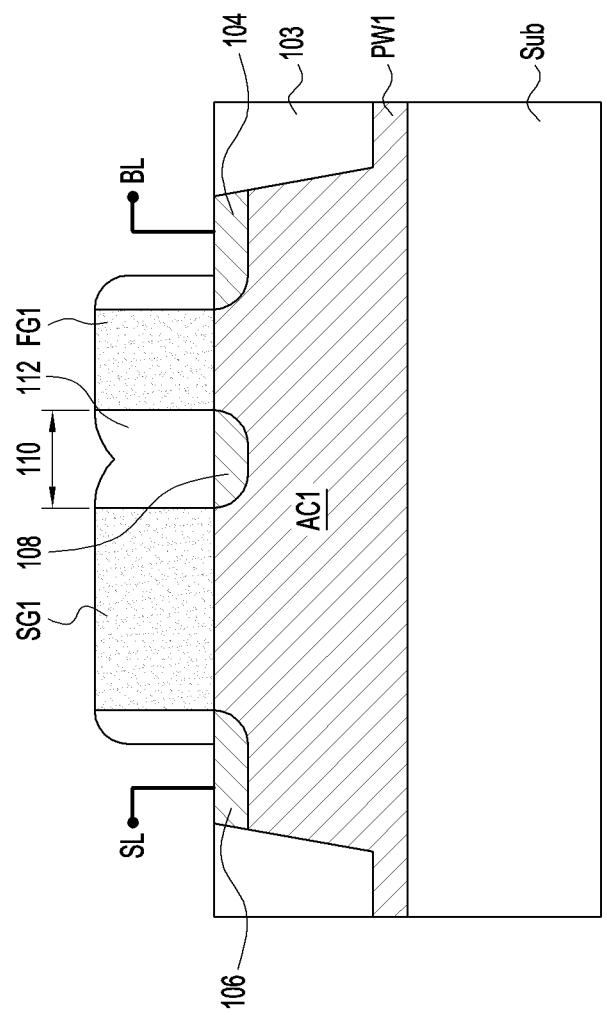
FIG. 4A is a cross-sectional view taken along a line A-A' in FIG. 3.

FIG. 3 is an example of a cell array of a non-volatile memory device based on some embodiments of the disclosed technology. FIG. 4A is a cross-sectional view taken along a line A-A' in FIG. 3, and FIG. 4B is a cross-sectional view taken along a line B-B' in FIG. 3.

Referring to FIGS. 1, 3, 4A and 4B, the non-volatile memory device implemented based on some embodiments of the disclosed technology may include a cell array 11. The cell array 11 may include a plurality of sub-arrays 11-1 and 11-2 arranged in rows and columns in a matrix array. Each of the sub-arrays 11-1 and 11-2 may include first to fourth unit cells 10-1 to 10-4. Because the sub-arrays 11-1 and 11-2 may be arranged in the matrix array, the adjacent sub-arrays 11-1 and 11-2 may be symmetrical about the first and second directions D1 and D2.

Each of the sub-arrays 11-1 and 11-2 may include a second well region NW, a first well region PW1 and a third well region PW2. The second well region NW may be formed in the substrate Sub. The second well region NW may have the second conductive type. The first well region PW1 may be positioned over the second well region NW. The first well region PW1 may have the first conductive type. The third well region PW2 may be positioned under the second well region NW. The third well region PW2 may have the first conductive type. The first well region PW1, the second well region NW and the third well region PW2 may be formed by implanting ions into the substrate Sub. The first well region PW1 and the third well region PW2 may be formed by implanting P type impurities such as boron (B) into the substrate Sub. The second well region NW may be formed by implanting N type impurities such as phosphorus (P), arsenic (As), etc. The first well region PW1, the second well region NW and the third well region PW2 may have a linear planar shape extended in the second direction D2. In an implementation, the first well region PW1, the second well region NW and the third well region PW2 may be spaced apart from each other in the first direction D1, not restricted within a specific structure. In another implementation, the second well region NW may be in direct contact with the first well region PW1 and the third well region PW2, respectively.

The substrate Sub may include a semiconductor substrate. The semiconductor substrate Sub may include monocrystalline silicon. For example, the substrate Sub may include a bulk silicon substrate, a silicon-on-insulator (SOI) substrate including a supporting substrate, an insulation layer and a monocrystalline silicon layer sequentially stacked, etc.

Each of the first well region PW1 and the third well region PW2 may include a first active region AC1 defined by an isolation layer 103 in the substrate Sub. The first active region AC1 may be used for the program operation and the read operation. The first active region AC1 may have a linear planar shape extended in the second direction D2. By way of example, FIG. 3 shows one first active region AC1 in each of the first well region PW1 and the third well region PW2. In another implementation, each of the first well region PW1 and the third well region PW2 may include more than one first active regions AC1. For example, each of the first well region PW1 and the third well region PW2 may include two first active regions AC1 spaced apart from each other in the first direction D1.

The second well region NW may include a second active region AC2 defined by the isolation layer 103. The second active region AC2 may be used for the program operation and the erase operation. That is, the second active region AC2 may be used as the active control gate ACG. Thus, the coupling ratios may be different from each other depending on the operational modes, suppressing the disturbance and improving the operational reliability. The second active region AC2 may extend in the first direction D1. The second active region AC2 extending in the first direction D1 may prevent or reduce interference and punch-through effect between the first and second selection gates SG1 and SG2, and the second active region AC2. Here, the punch-through effect may include an undesired electrical connection between the first and second selection gates SG1 and SG2, and the second active region AC2.

The isolation layer 103 may be formed by a shallow trench isolation (STI) process. The isolation layer 103 may include an insulation material. The isolation layer 103 may have a depth measured from the top surface of the substrate Sub. In an implementation, the depths of the first well region PW1, the second well region NW and the third well region PW2 may be deeper than that of the isolation layer 103. In another implementation, the depth of the isolation layer 103 may be substantially equal to or deeper than the depths of the first well region PW1, the second well region NW and the third well region PW2.

Each of the sub-arrays 11-1 and 11-2 may include the first selection gate SG1 and the second selection gate SG2 formed at the substrate Sub. The first selection gate SG1 may be used as a word line of the first unit cell 10-1 and the third unit cell 10-3. The second selection gate SG2 may be used as a word line of the second unit cell 10-2 and the fourth unit cell 10-4. Each of the first selection gate SG1 and the second selection gate SG2 may function to prevent the over-erase in the erase operation. The first selection gate SG1 and the second selection gate SG2 may be spaced apart from each other in the second direction D2. Further, the selection gate SG1 and the second selection gate SG2 may be parallel to each other. A gap (g1) between the second active region AC2 and the first selection gate SG1 may be identical or similar to a gap (g2) between the second active region AC2 and the second selection gate SG2. The gaps (g1 and g2) are sufficiently wide to effectively prevent the interference and the punch-through effect between the second active region AC2 and the first and second selection gates SG1 and SG2.

Each of the sub-arrays 11-1 and 11-2 may include a first floating gate FG1, a second floating gate FG2, a third floating gate FG3 and a fourth floating gate FG4 structured to be coupled to the second active region AC2. In some implementations, the first to fourth floating gates FG1 to FG4 are arranged in a longitudinal direction of the second active region AC2. In some implementations, the first and third floating gates FG1 and FG3 are arranged at one side of the second active region AC2 that extends in the longitudinal direction of the second active region AC2, and the second and fourth floating gates FG2 and FG4 are arranged at the other side of the second active region AC2 that extends in the longitudinal direction of the second active region AC2. Each of the first to fourth floating gates FG1 to FG4 includes a branch structured to extend toward the second active region AC2. The branches of the first to fourth floating gates FG1 to FG4 are coupled to the second active region AC2 and are spaced apart from one another. In one example, the branches may include the second regions 102 of the first and fourth floating gates FG1 and FG4. In some implementations, the first to fourth floating gates FG1, FG2, FG3 and FG4 may be structured to partially overlap with the second active region AC2. The first to fourth floating gates FG1, FG2, FG3 and FG4 may correspond to the first to fourth unit cells 10-1, 10-2, 10-3 and respectively. The first to fourth floating gates FG1, FG2, FG3 and FG4 may store electrical charge corresponding to one or more bits of information. The first to fourth floating gates FG1, FG2, FG3 and FG4 may overlap with the first active region AC1 and the second active region AC2. The first floating gate FG1 and the third floating gate FG3 may be arranged adjacent to the first selection gate SG1 and may be spaced apart from the first selection gate SG1 by a gap 110. The second floating gate FG2 and the fourth floating gate FG4 may be arranged adjacent to the second selection gate SG2 and may be spaced apart from the second selection gate SG2 by the gap 110. The gap 110 may be filled with an insulation structure 112. The insulation structure 112 may include a spacer formed on a sidewall of each of the selection gates SG1 and SG2 and the floating gates FG1-FG4.

The second region 102 of the first and fourth floating gates FG1 and FG4 may be connected to one end or the other end of the first region 101 of the first and fourth floating gates FG1 and FG4 so that the first and fourth floating gates FG1 and FG4 may have an "L" shape. In contrast, the second region 102 of the second and third floating gates FG2 and FG3 may be connected to one end or the other end of the first region 101 of the second and third floating gates FG2 and FG3 so that a horizontal cross section of each of the second and third floating gates FG2 and FG3 may have a vertical linear structure with a protruding horizontal linear structure. In one example, cross sections of the second and third floating gates FG2 and FG3 may have Tonfa shapes or "T" shapes. Thus, the first floating gate FG1 and the third floating gate FG3 facing each other in the first direction D1 may have asymmetrically shapes. Further, as illustrated in the plan view on FIG. 3, the first floating gate FG1 and the second floating gate FG2 facing each other in the second direction D2 may have asymmetrically shapes. The third floating gate FG3 and the fourth floating gate FG4 facing each other in the second direction D2 may have asymmetrically shapes. The fourth floating gate FG4 and the second floating gate FG2 facing each other in the first direction D1 may have asymmetrically shapes. These shapes of the floating gates FG1, FG2, FG3 and FG4 may prevent the interference between the floating gates FG1, FG2, FG3 and FG4 and provide the second capacitor C2 in each of the unit cells 10-1-10-4 with a uniform capacitance to prevent or reduce discrepancy between the coupling ratios with respect to the floating gates FG1-FG4. Thus, each of the unit cells 10-1-10-4 may include floating gates FG1-FG4 that are asymmetrical from each other and have branches spaced apart from each other to improve the threshold voltage uniformity. As a result, the reliability of the read operation may be improved.

In some implementations, each of the first to fourth floating gates FG1-FG4 may include the first region 101 and the second region 102. The first region 101 may have a structure that extends in the first direction D1. The second region 102 may protrude or extend from the first region 101 in the second direction D2. The first region 101 may partially overlap with the first active region AC1. The second region 102 may partially overlap with the second active region AC2. In order for the first capacitor C1 in FIG. 2A and FIG. 2B to have a sufficiently high capacitance, the first region 101 may have a length longer than a length of the second region 102. Further, in order for the second capacitor C2 of each of the unit cells 10-1-10-4 in FIG. 2A and FIG. 2B to have uniform capacitance, the second region 102 may be structured to cross the second active region AC2. In one example, the second region 102 may be structured to cross the isolation layer 103 and the second active region AC2 along the second direction D2. Thus, the second active region AC2 and the first to fourth floating gates FG1-FG4 may have substantially the same overlapped area.

The second regions 102 of the first to fourth floating gates FG1-FG4 may be spaced apart from each other in the first direction D1. The second region 102 may be located at a central portion of the second active region AC2. The second regions 102 of the second and third floating gates FG2 and FG3 may be positioned at one edge and the other edge of the second active region AC2, respectively. The gap S between the second active region AC2 and the first to fourth floating gates FG1-FGF4 may be identical or similar.

The first active region AC1 in each of the sub-arrays may include a first junction region 104 formed between the first floating gate FG1 and the second floating gate FG2, and between the third floating gate FG3 and the fourth floating gate FG4. Further, the first active region AC1 may include a second junction region 106 and a third junction region 108. The second junction region 106 may be formed in the first active region AC1 adjacent to the first and second selection gates SG1 and SG2. The third junction region 108 may be formed under the insulation structure 112 in the gap 110. The first, second and third junction regions 104, 106 and 108 may include impurity regions formed by implanting the second conductive type impurities into the first active region AC1. The first junction region 104 and the second junction region 106 may have an LDD structure. The third junction region 108 may function as to electrically connect an induced channel by the selection gate and the floating gate with the first active region AC1. The first junction region 104 may be connected to the bit line BL. A portion of the first junction region 104 between the first floating gate FG1 and the second floating gate FG2 and a portion of the first junction region 104 between the third floating gate FG3 and the fourth floating gate FG4 may be connected to different bit lines BL. The second junction region 106 may be connected to the source line SL. A portion of the second junction region 106 adjacent to the first selection gate SG1 and a portion of the second junction region 106 adjacent to the second selection gate SG2 may be electrically connected to different source lines SL.

The second active region AC2 in each of the sub-arrays 11-1 and 11-2 may be electrically connected with an activation control line ACL parallel to the bit line BL. Although not depicted in the drawings, the second active region AC2 may further include an impurity region for reducing a contact resistance between the activation control line ACL and the second active region AC2. The impurity region may be formed by implanting the second conductive type impurities. The impurity region may have a doping concentration higher than a doping concentration of the impurity region in the second well region NW.

In some embodiments of the disclosed technology, the plurality of the floating gates FG1-FG4 overlapping with the second active region AC2 may have asymmetrical shapes to prevent or reduce discrepancy between the coupling ratios with respect to the floating gates FG1-FG4. Thus, the non-volatile memory device may have a uniform threshold voltage, improving the reliability of a read operation.

Further, gaps (g1, g2) between the selection gates SG1 and SG2 and the second active region AC2 and a gap(S) between the floating gates FG1-FG4 may be sufficiently wide to more improve the operational reliability.

The technical features disclosed in this patent document can be implemented in various configurations or ways and the disclosed embodiments are merely examples of certain implementations. Variations and enhancements of the disclosed embodiments and other embodiments can be made based on what is disclosed and/or illustrated in this patent document.

What is claimed is:

1. A memory device comprising:
    an active control gate extending a first direction; and
    a plurality of unit cells configured to share the active control gate, each of the unit cells including a selection gate extending parallel to the active control gate, and a floating gate including a first portion extending parallel to the selection gate between the selection gate and the active control gate and a second portion extending from the first portion and overlapping the active control gate,
    wherein areas of the second portions of the floating gates are substantially the same, and the second portions of the floating gates are arranged in parallel with equal spacing.

2. The memory device of claim 1, wherein the plurality of unit cells comprises:
    a first unit cell arranged on one side of the active control gate; and
    a second unit cell arranged on another side of the active control gate.

3. The memory device of claim 2, wherein the second portion of the first unit cell extends from one end of the first portion of the first unit cell, and
    wherein the second portion of the second unit cell extends from a sidewall of the first portion of the second unit cell, and the sidewall of the first portion faces the active control gate.

4. The memory device of claim 2, wherein the plurality of unit cells further comprises:
    a third unit cell arranged on one side of the active control gate and arranged adjacent to the first unit cell in the first direction; and
    a fourth unit cell arranged on another side of the active control gate and arranged adjacent to the second unit cell in the first direction.

5. The memory device of claim 4, wherein the first unit cell and the fourth unit cell are arranged to be diagonally symmetrical, and the second unit cell and the third unit cell are arranged to be diagonally symmetrical.

6. The memory device of claim 4, wherein the second portion of the third unit cell extends from a sidewall of the first portion of the third unit cell, and the sidewall of the first portion of the third unit cell faces the active control gate, and
    wherein the second portion of the fourth unit cell extends from one end of the first portion of the fourth unit cell.

7. The memory device of claim 1, wherein the second portions of the plurality of unit cells extend in a second direction perpendicular to the first direction.

* * * * *